United States Patent [19]
Jobling et al.

[11] Patent Number: 4,855,651
[45] Date of Patent: Aug. 8, 1989

[54] TIMEBASE CIRCUIT

[75] Inventors: David T. Jobling, Geneva; Anthony D. Newton, Le Vaud, both of Switzerland

[73] Assignee: Motorola, Inc., Schaumburg, Ill.

[21] Appl. No.: 739,951

[22] Filed: May 31, 1985

[30] Foreign Application Priority Data

Jun. 5, 1984 [GB] United Kingdom ............... 8414313

[51] Int. Cl.$^4$ ............................................. H01J 29/70
[52] U.S. Cl. ................................... 315/387; 315/389; 315/403; 328/184; 328/183
[58] Field of Search ............... 315/387, 389, 403, 408; 328/183, 184

[56] References Cited

U.S. PATENT DOCUMENTS

| | | | |
|---|---|---|---|
| 3,529,206 | 9/1970 | Rodal | 315/387 |
| 3,909,734 | 9/1975 | Palombo et al. | 328/184 |
| 3,935,529 | 1/1976 | Kalmanash et al. | 315/387 |
| 3,970,894 | 7/1976 | Yasuda et al. | 315/387 |
| 4,009,399 | 2/1977 | Hofer | 328/184 |
| 4,129,832 | 12/1978 | Neal et al. | 328/184 |
| 4,361,786 | 11/1982 | Schiller | 315/389 |
| 4,547,711 | 10/1985 | Gehrmann | 315/389 |

Primary Examiner—Thomas H. Tarcza
Assistant Examiner—David Cain
Attorney, Agent, or Firm—Michael D. Bingham

[57] ABSTRACT

A timebase circuit for use in the vertical timebase of a television receiver in which a linearity control current fed to the ramp capacitor is derived by multiplying a current proportional to the difference between the instantaneous and average ramp voltages by a reference current which may be adjusted to control linearity.

6 Claims, 1 Drawing Sheet

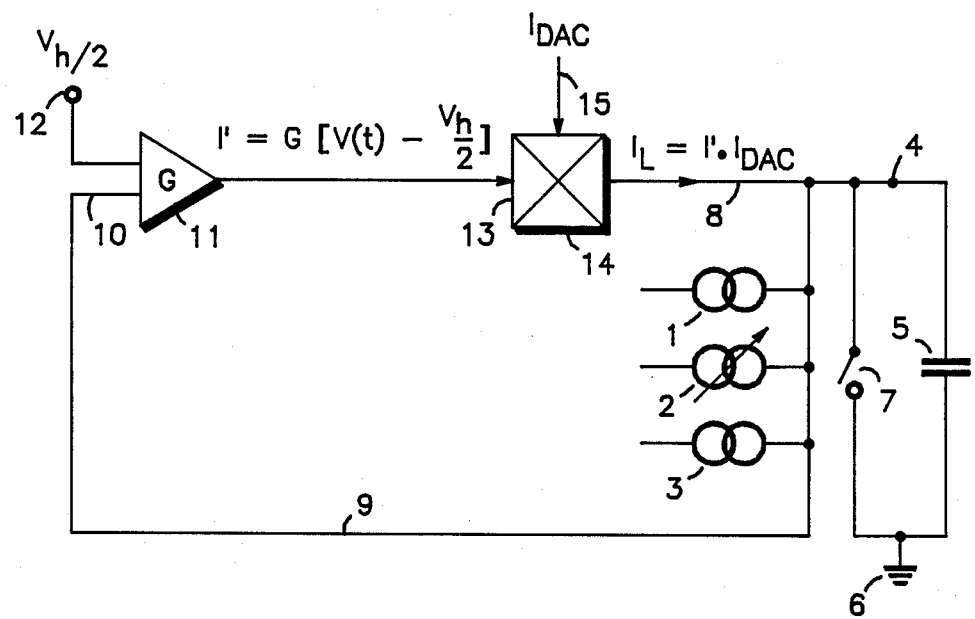

TIMEBASE CIRCUIT

FIELD OF INVENTION

The present invention relates to a timebase circuit suitable for use in a television receiver. The invention relates more particularly to a vertical (field) timebase circuit.

BACKGROUND ART

In its simplest form the waveform generated by a vertical timebase circuit comprises a linear sawtooth waveform. This waveform is typically generated by charging and periodically discharging a ramp capacitor.

In practice problems arise in utilising a linear ramp current. The external driver circuit which applies the generated ramp current to the vertical deflection coils is non-linear. Secondly the picture tube may not have a linear deflection versus current characteristic.

This invention seeks to provide a timebase circuit in which the above mentioned problems are mitigated.

BRIEF DESCRIPTION OF INVENTION

In accordance with the invention in its broadest aspect a linearity control current is generated for adding to the current fed to the ramp capacitor.

In an embodiment of the invention the control current is dependent on the ramp voltage and is preferably symmetrical about the centre of the vertical scan and when integrated on the ramp capacitor provides a component of the ramp voltage which is second order in time.

In a preferred embodiment a current proportional to the difference between the instantaneous ramp voltage and the average, centre screen ramp voltage is multiplied by a reference current to provide the linearity control current.

BRIEF DESCRIPTION OF DRAWINGS

An exemplary embodiment of the invention will now be described with reference to the single FIGURE drawing which illustrates schematically a preferred embodiment of a timebase circuit in accordance with the present invention.

DETAILED DESCRIPTION OF INVENTION

The vertical timebase circuit illustrated comprises current sources 1, 2 and 3 which feed current to a terminal 4 to charge a capacitor 5 connected in operation between the terminal 4 and a reference terminal 6 which is typically an earth terminal.

The combined current fed to the terminal 4 forms on the capacitor the vertical ramp current and the timebase sawtooth waveform is derived by periodically discharging the capacitor 5 by means of a switch 7 connected across the capacitor 5 between the terminal 4 and the earth terminal 6.

The current generator 1 provides a fixed reference current typically of the order of 6 micro amps. The current source 2 provides an adjustable current of value typically between 0 and 3 micro amps and forms a factory preset picture height adjustment. The current source 3 is a compensation current which forms a subject of a copending application.

In accordance with the present invention and in order to compensate for the non linearity of external components a linearity control current is fed to the terminal 4 over line 8 where it is added to the other currents fed to the terminal 4.

The main nonlinearity term introduced by the external components is generally symetrical about the centre of the vertical scan and is second order in time. In accordance with a feature of the invention the linearity control current provides a correction to the ramp current which is also symetrical about centre of the vertical scan and is second order in time.

To generate the linearity control current the ramp voltage at the terminal 4 is fed over a line 9 to an input 10 of a differential amplifier 11 which has a transconductance G. A second input 12 of the comparator 11 receives a reference voltage $V_h/2$ which is half the maximum ramp voltage ie is the ramp voltage at the centre screen position when the tube beam is undeflected vertically.

Output current provided by the comparator 11 is fed to a first input 13 of a multiplier 14. A second input 15 of the multiplier 14 receives a reference current $I_{DAC}$ which is typically supplied from the output of a digital to analogue converter. The current $I_{DAC}$ is produced in response to a preselected digital code chosen in accordance with the characteristics of external components to give a satisfactory control current.

The resulting control current $I_L$ which is the multiple of the output current $I'$ of the comparator 11 and the reference current $I_{DAC}$ is linear w.r.t. time. This current is integrated on the capacitor 5 in order to produce a component of the ramp voltage which is second order in time. The current $I_L$ adjusts the linearity without changing the height of the picture because the current $I'$ is symetrical about zero, ie about a centre screen value. Any change in the value of $I'$ due to temperature, or any change in the value of $I_{DAC}$ will not effect the resulting overall picture height.

The invention is particularly applicable to manufacture as part of an integrated circuit and in the illustrated embodiment all those components with the exception of the external ramp capacitor 5 would be integrated.

The invention has been described by way of example and modifications may be made without departing from the scope of the invention. For example although the invention has been described with particular reference to a domestic television receiver the invention is also equally applicable the control of linearity in any television type display such as a monitor a computer display or a graphics display. Also as illustrated the current $I_{DAC}$ has been illustrated as being derived from the output of a digital to analogue converter. This facilitates the incorporation of the invention as part of a microprocessor controlled television signal processing circuit. However the reference current $I_{DAC}$ could be provided by any convenient means.

We claim:

1. A timebase circuit for a television picture tube comprising current source means for providing a first current for charging a capacitor to produce a ramp voltage; means for continuously monitoring the ramp voltage and for deriving a correction current whose value is continuously dependent upon the monitored instantaneous ramp voltage and means for adding the correction current to the first current during generation of the entire ramp voltage thereby providing dynamic correction to said ramp voltage such that the corrected ramp voltage produces a substantially linear deflection characteristic on the picture tube wherein the correction current is dependent upon the ramp voltage to provide, when integrated on the capacitor, a component of the ramp voltage which is second order in time.

2. The circuit of claim 1 wherein the correction current is symmetrical about the center of the ramp voltage, being varied about a reference voltage which is half the maximum ramp voltage.

3. The circuit of claim 2 wherein the means for deriving a correction current includes means for producing a difference current propositional to the difference between the instantaneous and the average ramp voltages.

4. The circuit of claim 3 wherein the means for producing a difference current comprises a differential amplifier.

5. The circuit of claim 3 and further including means for multiplying the difference current by a reference current to provide the correction current.

6. The timebase circuit as claimed in claim 5 including a digital to analogue converter for providing the reference current in response to a predetermined digital code.

* * * * *